(12) United States Patent
Ma

(10) Patent No.: US 6,466,014 B1
(45) Date of Patent: Oct. 15, 2002

(54) SUPPRESSION OF FAT SIGNALS IN MR WATER IMAGES PRODUCED IN DIXON IMAGING

(75) Inventor: Jingfei Ma, Waukesha, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 09/650,251

(22) Filed: Aug. 29, 2000

(51) Int. Cl.⁷ .................................................. G01V 3/00
(52) U.S. Cl. ........................................ 324/307; 324/309
(58) Field of Search ................................. 324/307, 309, 324/320, 322, 318, 314

(56) References Cited

U.S. PATENT DOCUMENTS

| | | | |
|---|---|---|---|
| 4,949,042 A | * 8/1990 | Kuhara et al. | 324/311 |
| 5,134,372 A | * 7/1992 | Inoue | 324/309 |
| 5,144,235 A | 9/1992 | Glover et al. | 324/309 |
| 5,225,781 A | 7/1993 | Glover et al. | 324/309 |
| 5,321,359 A | * 6/1994 | Schneider | 324/307 |
| 5,560,360 A | * 10/1996 | Filler et al. | 324/307 |
| 5,627,469 A | * 5/1997 | Hong et al. | 324/309 |
| 5,909,119 A | * 6/1999 | Zhang et al. | 324/309 |
| 6,016,057 A | * 1/2000 | Ma | 324/307 |
| 6,025,716 A | * 2/2000 | Deimling | 324/309 |
| 6,091,242 A | * 7/2000 | Hanawa | 324/307 |
| 6,091,243 A | * 7/2000 | Xiang et al. | 324/307 |
| 6,339,332 B1 | * 1/2002 | Deimling | 324/307 |

* cited by examiner

*Primary Examiner*—Edward Lefkowitz
*Assistant Examiner*—Dixomara Vargas
(74) *Attorney, Agent, or Firm*—Quarles & Brady, LLP

(57) ABSTRACT

MRI acquisitions are performed to acquire data from which separate water and fat images may be reconstructed using a Dixon technique. Fat signal components intermixed with the water image are suppressed by shifting the pixels in the fat image and subtracting a fraction of this pixel shifted fat image from the water image.

19 Claims, 2 Drawing Sheets

SUPPRESSION OF FAT SIGNALS IN MR WATER IMAGES PRODUCED IN DIXON IMAGING

BACKGROUND OF THE INVENTION

The field of the invention is nuclear magnetic resonance imaging methods and systems. More particularly, the invention relates to the separation of fat and water signals in MR images produced using the Dixon method.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. An NMR signal is emitted by the excited spins, and after the excitation signal $B_1$ is terminated, this signal may be received and processed to form an image.

Materials other than water, principally fat, are found in biological tissue and have different gyromagnetic ratios. The Larmor frequency of protons in fat is shifted approximately 225 Hz from those of protons in water in a 1.5 Tesla polarizing magnetic field $B_0$. The difference between the Larmor frequencies of such different species of the same nucleus, viz., protons, is termed chemical shift, reflecting the differing chemical environments of the two species.

Often it is desired to "decompose" the NMR image into its several chemical shift components. In the exemplary case of protons, which will be used hereafter for illustration, it may be desired to portray as separate images the water and fat components of the subject. One method of accomplishing this is to acquire two images $S_0$ and $S_{-1}$ with the fat and water components of the images in phase, and out of phase by $\pi$ radians, respectively (the "Dixon" technique). Adding and subtracting these images provides separate fat and water images. The phase shift between the fat and water components of the images may be controlled by timing the RF pulses of the NMR sequence so that the signal from the fat image evolves in phase with respect to the water by the proper angle of exactly $\pi$, before the NMR signal is acquired.

In the ideal case above, the frequency of the RF transmitter is adjusted to match the Larmor frequency of the water. If the polarizing magnetic field $B_0$ is uniform, this resonance condition is achieved through out the entire subject. Similarly, the out-of-phase condition ($\pi$ radians) for the fat component is achieved for all locations in the subject under homogeneous field conditions. In this case, the decomposition into the separate images is ideal in that fat is completely suppressed in the water image, and vice versa.

When the polarizing field is inhomogeneous, however, there are locations in the subject for which the water is not on resonance. In this case, the accuracy of the decomposition breaks down and the water and fat images contain admixtures of the two species. Field inhomogeneities may result from improper adjustment or shimming of the polarizing magnetic field $B_0$, but are more typically the result of "demagnetization" effects caused by the variations in magnetic susceptibility of the imaged tissue, which locally distort the polarizing magnetic field $B_0$. These demagnetization effects may be of short spatial extent but of conventional linear or higher order shimming techniques.

The influence of demagnetization may be accommodated, however, by a three-point Dixon imaging technique that uses three acquired images $S_0$, $S_1$ and $S_{-1}$, with the phase evolution times adjusted so that the fat and water components of the images are in phase, out of phase by $\pi$, and out of phase by $-\pi$ respectively. The complex pixels in each of the three images after conventional reconstruction may be processed as described, for example, in U.S. Pat. No. 5,144,235 to produce a separate water and a separate fat image.

An important assumption in Dixon imaging is that the spectral composition of living tissues is made of two distinct $\delta$-peaks, one corresponding to the water proton resonance and the other corresponding to a loosely termed "fat" resonance peak. The latter is approximately 3.35 ppm, or 225 Hz at 1.5 Tesla field strength, apart from the water resonance frequency. In reality, the "fat" is composed of multiple spectral components. Table 1, lists the major spectral components of corn oil that was measured at 1.5 Tesla.

TABLE 1

Amplitude, T1 and T2 of the corn oil sample at 1.5 Tesla
(assuming water chemical shift is 4.7 ppm.)

| No. | Component | Amplitude A(n) | T1(n) (ms) | T2(n) (ms) | Chemical Shift (ppm) | Freq Shift From Water Signal (Hz) |
|---|---|---|---|---|---|---|
| 1 | $CH_2$ | 0.26 | 577 | 227 | 0.8 | −250 |
| 2 | $(CH_2)_n$ | 1.00 | 223 | 107 | 1.2 | −220 |
| 3 | $O=C-CH_2CH_2$ | 0.10 | 185 | 43 | 1.5 | −200 |
| 4 | $C=C-CH_2$ | 0.21 | 209 | 67 | 1.9 | −180 |
| 5 | $O=C-CH_2$ | 0.11 | 210 | 71 | 2.15 | −160 |
| 6 | $C-CH_2-C=$ | 0.05 | 245 | 183 | 2.6 | −135 |
| 7 | $CH_2O$(right) | 0.04 | 237 | 36 | 3.95 | −48 |
| 8 | $CH_2O$(left) | 0.04 | 242 | 38 | 4.15 | −35 |
| 9 | $CH=CH$ AND $CHO$ | 0.15 | 204 | 137 | 5.2 | 30 |

As illustrated in Table 1, the loosely-termed "fat" peak is actually composed of a series of peaks (Peaks 1–6) dominated by Peak #2 that corresponds to the methylene protons. In addition, there is actually another group of peaks (Peaks 7–9) whose frequencies fall more closely to the water resonance frequency. The signals from these protons that generate these latter peaks intermix with the "water" signals and are not separated properly by the Dixon method.

SUMMARY OF THE INVENTION

The present invention is an improved method for producing separate water and fat images. More specifically, the invention includes acquiring MRI data with an MRI system using a pulse sequence in which separate water and fat images may be reconstructed, producing a pixel shifted fat image from a reconstructed fat image which indicates fat signal components intermixed with a reconstructed water image, multiplying the pixel shifted fat image by a factor a, and subtracting the result from the water image. Fat signal components that are not separated from the water signal are emulated by the pixel shifted fat image and subtracted from the water image to remove them therefrom.

DESCRIPTION OF THE PREFERRED EMBODIMENT

Figure 1:
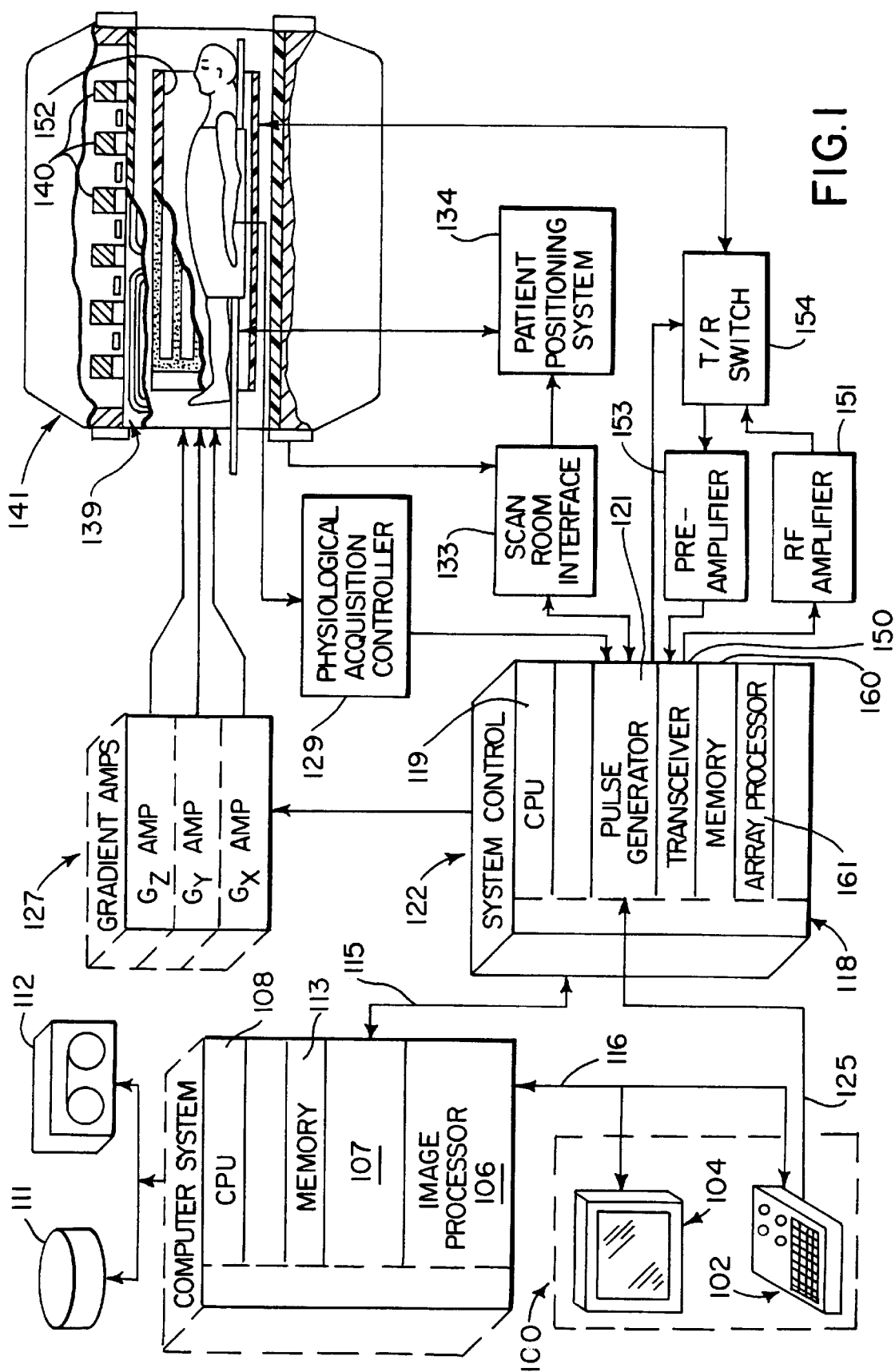
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104. For a more detailed description of the transceiver 150, reference is made to U.S. Pat. Nos. 4,952,877 and 4,992,736 which are incorporated herein by reference.

The following discussion considers a spin echo pulse sequence employed by the above described apparatus and suitable for use with the present invention. It should be understood, however, that the invention may be used with other pulse sequences as will be apparent to one skilled in the art.

Referring to FIG. 4, a spin echo pulse sequence begins with the transmission of a narrow bandwidth radio frequency (F) pulse 50. The energy and the phase of this initial RF pulse 50 may be controlled such that at its termination, the magnetic moments of the individual nuclei are precessing around the z axis within the x-y plane. A pulse of such energy and duration is termed a 90° RF pulse.

The result of a combination of RF pulse 50 and a z axis gradient pulse $G_z$ (not shown) is that the nuclear spins of a narrow slice in the imaged object along an x-y plane are excited into resonance. Only those spins with a Larmor frequency, under the combined field $G_z$ and $B_0$, equal to the frequencies of the RF pulse 50 will be excited. Hence the position of the slice may be controlled by the gradient $G_z$ offset or the RF frequency.

After the 90° RF pulse 50 the precessing spins begin to dephase according to their chemical shifts which cause the spins of certain chemical species to precess faster than others and the action of the applied gradients which cause spatially dependent off resonance conditions. At time TE/2 after the application of 90° RF pulse 50, a 180° RF pulse 54 may be applied which as the effect of rephasing the spins to produce a spin echo 56 at time TE after the 90° RF pulse 50. This spin echo signal 56 is acquired during a readout gradient 53. As is understood in the art, a dephaser pulse 52 is applied after the 90° RF pulse but before the readout gradient to center the spin echo within the read out gradient. The spin echo signal 56 is sampled at a rate which determines the resolution of the acquired image along the readout gradient axis. For example, 256 samples are typically acquired.

With the 180° RF pulse 54 centered at time TE/2, any constant off resonance-induced phase shifts, including the chemical shift of fat relative to water, will be completely rephased at the time of the spin echo 56. This timing produces an $S_0$ signal which, consequently, will have no off resonance phase encoding. The time of the 180° pulse 54, however, may be shifted forward to back by time $\tau$ from the time TE/2. In this case, the fat and water proton spins will not be in phase but will be shifted with respect to each other by $2\tau\omega_{cs}$, where $\omega_{cs}$ is the difference in Larmor frequencies between water and fat. The value of the phase shift between the fat and water images caused by their chemical shift will be designated $\theta$. At the same time, any constant resonance offset $\omega_0$ will be phase encoded by an amount $\phi=2\omega_0\tau$. This sequence is repeated with different $G_y$ gradient pulses 57, as is understood in the art, to acquire a k-space NMR data set from which an image of the imaged object may be reconstructed according to conventional reconstruction techniques using the Fourier transform. The number of separate phase encodings employed in the scan determines image resolution along the phase encoding gradient axis. For example, 128 phase encodings are typically acquired.

In the three point Dixon method, three images $S_i$ are acquired using this pulse sequence. Each image $S_i$ has a different phase shift value $\theta$ between the water and fat components, as follows: $S_0$ where $\theta=0$, $S_1$ where $\theta=\pi$, and $S_2$, where $\theta=-\pi$.

Figure 2:
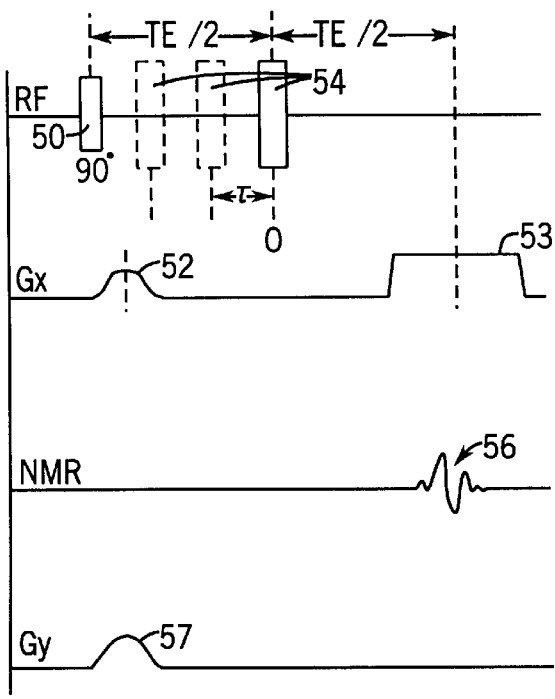
FIG. 2 is a graphic illustration of a pulse sequence employed by the MRI system of FIG. 1 to acquire data.
Figure 3:
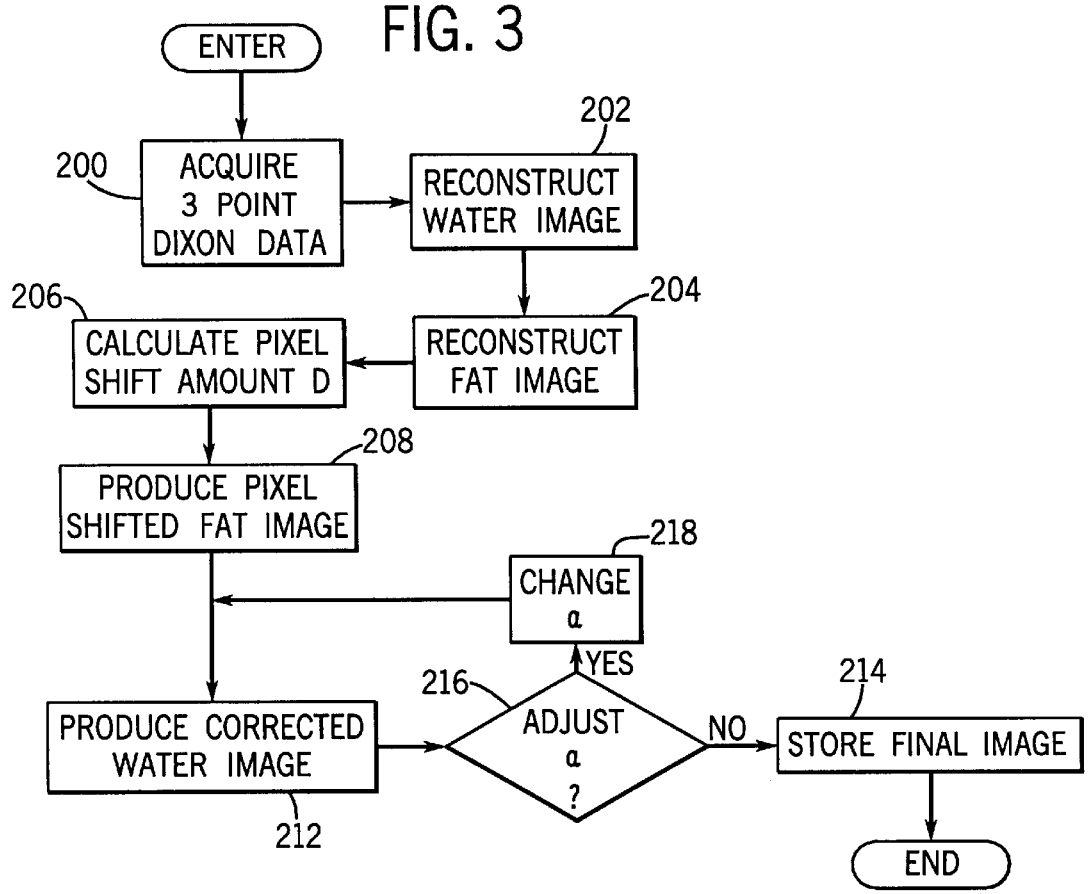
FIG. 3 is a flow chart of the process used to reconstruct an image according to the preferred embodiment of the invention.

Referring particularly to FIG. 3, the MRI system is operated with the pulse sequence of FIG. 2 to acquire three images as indicated at process block 200. The images are acquired with $\theta=0$, $\pi$ and $-\pi$ such that a water image (w) and a fat image (F) may be reconstructed using the 3-point Dixon method as indicated at process blocks 202 and 204. This assumes that the tissue spectra are composed of two $\delta$-peaks, one at 3.35 ppm and the other at the water resonance frequency. In the preferred embodiment the 3-point Dixon method is employed, but it can be appreciated that other water/fat separation methods such as the 2-point and 1-point Dixon methods may also be employed.

The water image is refined according to the present invention using information in the fat image. More specifically, the fat image is shifted along the frequency encoding axis by an amount D which corresponds to the 3.35 ppm separation between the predominant fat peak and the water peak. The amount D is determined at process block 206, and it is calculated as a function of the readout bandwidth in Hertz (BW), the image matrix size ($N_x$) along the readout axis, and the water/fat separation (3.35 ppm). At 1.5 Tesla field strength, the shift amount D is given as:

$$D=225*N_x/BW.$$

At a readout bandwidth BW of +/−16 kHz and with $N_x$=256, for example, the shift amount D is approximately 2 pixels. The fat image is shifted by the amount D as indicated at process block 208 and a loop is entered at 210 in which the water image is corrected using this shifted fat image (shift (F)). When the shift factor D is not an integral number, it is also possible to shift the fat image and interpolate between its pixels to produce a corrective image having the desired non-integral shift factor D.

As indicated at process block 212, the corrected water image (W') is produced by subtracting a small fraction ($\alpha$) of the shift fat image (shift (F)) from the acquired water image (W):

$$W'=W-\alpha*\text{shift }(F).$$

The factor $\alpha$ is determined by the relative amounts of the different fat components, the relaxation time constants of these components and the timing parameters (e.g. TR, TE, echo train length) in the pulse sequence used to acquire the MRI data. The value of $\alpha$ can be determined empirically or modeled using empirical data. For example, in a T1-weighted spin echo acquisition, $\alpha$ is usually in the range of 0.05 to 0.10.

This initial value of $\alpha$ is entered and a corrected water image is produced at 212 and displayed to the operator. If the image is optimal, the image is stored as indicated at process block 214 and the process ends. Otherwise, the process branches at decision block 216 and the factor $\alpha$ is adjusted at process block 218 before producing another corrected water image at process block 212. Adjustments are made until the fat signal is optimally removed from the water image.

The optimal value of the scaling factor $\alpha$ is application specific. For example, for a quantitative water/fat image, the value of $\alpha$ may be chosen for best fat suppression. On the other hand, such an image may not be optimal for visualization from a clinical diagnostic standpoint. For example, a certain amount of fat signal may be maintained in the image so as not to create dark voids that may be distractive. In such cases the water image is "fat-managed" by choosing a value of $\alpha$ that results in the best visualization of the anatomy.

What is claimed is:

1. A method for producing an image with magnetic resonance imaging (MRI) system, the steps comprising:

a) acquiring a plurality of image data sets with the MRI system;

b) reconstructing a water image from the acquired image data;

c) reconstructing a fat image from the acquired image data;

d) producing a pixel shifted fat image from the reconstructed fat image;

e) multiplying the pixel shifted fat image by a factor $\alpha$; and f) subtracting the result of step e) from the water image.

2. The method as recited in claim 1 in which step d) is performed by:

i) calculating a pixel shift amount D; and ii) shifting the location of each pixel in the reconstructed fat image by the amount D.

3. The method as recited in claim 2 in which the plurality of image data sets are acquired using an imaging pulse sequence that produces a readout gradient and the location of pixels in the fat image are shifted in step ii) along the readout gradient direction.

4. The method as recited in claim 3 in which the pixel shift amount D is determined by the expression:

$$D=\text{constant}*N_x/BW,$$

where: constant is determined by the polarizing magnetic field strength of the MRI system;

$N_x$ is the number of pixels along the direction of the readout gradient; and

BW is the bandwidth at which the image data sets are acquired.

5. The method as recited in claim 1 in which three image data sets are acquired and the water and fat images are produced therefrom using a three-point Dixon method.

6. The method as recited in claim 4 in which three image data sets are acquired and the water and fat images are produced therefrom using a three-point Dixon method.

7. The method as recited in claim 1 in which factor $\alpha$ is between 0.05 and 0.10.

8. The method as recited in claim 4 in which the factor $\alpha$ is between 0.05 and 0.10.

9. The method as recited in claim 1 in which steps e) and f) are repeated with a different value for the factor $\alpha$ until the optimal water image is produced.

10. The method as recited in claim 4 in which steps e) and f) are repeated with a different value for the factor $\alpha$ until the optimal water image is produced.

11. The method as recited in claim 1 in which the value of the factor $\alpha$ is calculated based on a number of pulse sequence parameters, the value of $\alpha$ is adjusted, and steps e) and f) are repeated using the adjusted value of the factor $\alpha$.

12. The method as recited in claim 1 in which step a) is performed using a pulse sequence in which an rf excitation pulse is produced by the MRI system and an NMR signal is acquired at a time TE thereafter, and the time TE is different in the pulse sequences used to acquire each of the plurality of image data sets.

13. A magnetic resonance imaging system which comprises:

a magnet for producing a polarizing magnetic field;

an rf system for producing an rf excitation field and for receiving an NMR signal produced by spins excited by the rf excitation field;

a gradient system for producing imaging gradients;

a pulse generator for operating the rf system and gradient system in accordance with a prescribed pulse sequence to acquire NMR signals from which images are reconstructed;

means for directing the pulse generator to acquire a plurality of image data sets using a pulse sequence whose timing changes from one image data set acquisition to the next;

means for reconstructing a fat image from the acquired image data;

means for reconstructing a water image from the acquired image data;

means for producing a pixel shifted fat image from the reconstructed fat image;

multiplier means for multiplying the pixel shifted fat image by a factor $\alpha$; and subtraction means for subtracting the result of the multiplier means from the reconstructed water image.

14. The magnetic resonance imaging system as recited in claim 13 which includes:

a display for displaying the water image; and means for adjusting the value of the factor $\alpha$.

15. The magnetic resonance imaging system as recited in claim 13 in which three image data sets are acquired, and the means for reconstructing the fat and water images employs a Dixon method.

16. The magnetic resonance imaging system as recited in claim 13 in which the means for producing the pixel shifted fat image includes:

means for calculating a pixel shift amount D; and means for shifting the location of each pixel in the reconstructed fat image by the amount D.

17. The magnetic resonance imaging system as recited in claim 16 in which the gradient system produces a readout gradient and the rf system samples NMR signals $N_x$ times during the readout gradient, and the means for shifting the location of pixels in the reconstructed fat image shifts the locations along the direction of the readout gradient.

18. The magnetic resonance imaging system as recited in claim 17 in which the means for calculating the pixel shift amount D is responsive in part to the number of times $N_x$ that the NMR signals are sampled.

19. The magnetic resonance imaging system as recited in claim 18 in which the rf system acquires NMR signals at a prescribed bandwidth BW and the means for calculating the pixel shift amount D is responsive in part to the prescribed bandwidth BW.

* * * * *